(12) United States Patent
Kim et al.

(10) Patent No.: US 12,274,027 B2
(45) Date of Patent: Apr. 8, 2025

(54) HEAT SINK

(71) Applicant: HYOSUNG HEAVY INDUSTRIES CORPORATION, Seoul (KR)

(72) Inventors: Young Joo Kim, Busan (KR); Yong Soo Kim, Anyang-si (KR); Seung Boong Jeong, Anyang-si (KR); Jong Yun Choi, Hwaseong-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 77 days.

(21) Appl. No.: 17/914,718

(22) PCT Filed: May 7, 2021

(86) PCT No.: PCT/KR2021/005714
§ 371 (c)(1),
(2) Date: Sep. 26, 2022

(87) PCT Pub. No.: WO2021/235748
PCT Pub. Date: Nov. 25, 2021

(65) Prior Publication Data
US 2023/0354550 A1    Nov. 2, 2023

(30) Foreign Application Priority Data
May 19, 2020    (KR) .......................... 10-2020-0059541

(51) Int. Cl.
    *H05K 7/20*    (2006.01)
(52) U.S. Cl.
    CPC ....... *H05K 7/20272* (2013.01); *H05K 7/2039* (2013.01)

(58) Field of Classification Search
    CPC ............. H05K 7/20272; H05K 7/2039; H05K 7/20327; F28D 1/0472; F28D 2021/0029
    USPC ........................................................ 165/185
    See application file for complete search history.

(56) References Cited

U.S. PATENT DOCUMENTS

| | | | | |
|---|---|---|---|---|
| 4,614,227 A | * | 9/1986 | Vogel ..................... | H01L 23/473 257/E23.098 |
| 4,700,272 A | * | 10/1987 | Bellamy ............ | H05K 7/20636 174/12 R |
| 5,034,688 A | * | 7/1991 | Moulene ............... | H01L 23/345 219/521 |
| 5,186,238 A | * | 2/1993 | del Puerto ........ | H01L 21/67109 324/750.08 |
| 6,015,008 A | | 1/2000 | Kogure et al. | |

(Continued)

FOREIGN PATENT DOCUMENTS

| | | |
|---|---|---|
| JP | 06-080912 B2 | 10/1994 |
| JP | 08-204079 A | 8/1996 |

(Continued)

*Primary Examiner* — Steve S Tanenbaum
(74) *Attorney, Agent, or Firm* — Harvest IP Law, LLP

(57) ABSTRACT

A heat sink according to an example embodiment comprises: an inlet part through which a refrigerant is introduced; an outlet part through which the refrigerant received from the inlet part is discharged; and a plurality of flow channels disposed between the inlet part and the outlet part, configured to allow the refrigerant to flow, wherein the plurality of flow channels is arranged to have a spirally bent shape, and parts of the plurality of flow channels communicate with each other to allow the refrigerant to circulate between the flow channels.

6 Claims, 4 Drawing Sheets

(56) References Cited

U.S. PATENT DOCUMENTS

| | | | | |
|---|---|---|---|---|
| 8,120,915 B2* | 2/2012 | Pautsch | ................ | F28F 3/12 |
| | | | | 174/15.1 |
| 2011/0114288 A1* | 5/2011 | Miller | ................ | B01J 19/30 |
| | | | | 165/185 |

FOREIGN PATENT DOCUMENTS

| JP | H08204079 A | * | 8/1996 |
|---|---|---|---|
| JP | 2004-069234 A | | 3/2004 |
| JP | 2004-316955 A | | 11/2004 |
| KR | 10-0377652 B1 | | 1/2005 |
| KR | 10-2016-0129611 A | | 11/2016 |
| WO | 88 00430 A1 | | 1/1988 |

* cited by examiner

HEAT SINK

CROSS-REFERENCE TO RELATED APPLICATIONS

This application claims the benefit under 35 U.S.C. section 371, of PCT International Application No. PCT/KR2021/005714, filed on May 7, 2021, which claims foreign priority to Korean Patent Application No. 10-2020-0059541, filed on May 19, 2020, in the Korean Intellectual Property Office, both of which are hereby incorporated by reference in their entireties.

TECHNICAL FIELD

The following description relates to a heat sink.

BACKGROUND ART

Generally, a heat sink is a plate which emits heat generated from various heat sources such as power devices, electronic devices, mechatronics products, hybrid automobiles, and computers using conduction, convection, and radiation.

A heat sink should prevent the temperature from rising above the designed acceptable temperature when heat from the heat source does not disperse to the outside, and the cooling performance rapidly falls, causing severe damage such as heat-induced defects, reduced product life, and physical damage (explosions).

Therefore, when applying the heat sink to a high-heat-generating device, cooling efficiency is maximized by using a refrigerant cooling method.

In a conventional heat sink, a plurality of cooling fins is applied to the refrigerant conduit, which is formed in parallel in one direction, and the refrigerant introduced to the inlet part of the conduit flows along the conduit and is discharged through the outlet part of the conduit. In this process, the refrigerant receives conductive heat which is delivered from the electronic device to the heat sink and cools the heat sink.

Cooling efficiency of the heat sink decreases if the receiving area between the refrigerant and the heat sink is small. However, there is a limit to increasing the length, width, height, and others of the refrigerant conduit to increase the receiving area for heat transfer in the limited refrigerant conduit volume.

Also, if the cooling performance is not distributed evenly across the contact surface due to uneven temperature control of the contact surface between the heat sink and the electronic device, a hot spot may be formed on a specific part of the electronic device, causing severe damage such as heat-induced defects and physical damage (explosion) and reduced product life.

Korean Patent Application Publication No. 10-1999-0013502 discloses a heat sink.

DISCLOSURE OF THE INVENTION

Technical Goals

An aspect provides a heat sink having cooling performance that may be enhanced with turbulence flow and counter flow of a refrigerant.

An aspect provides a heat sink which has evenly distributed cooling performance through even temperature control of a contact surface between the heat sink and an electronic device.

Technical Solutions

According to an aspect, there is provided a heat sink which includes an inlet part through which a refrigerant is introduced, an outlet part through which the refrigerant received from the inlet part is discharged, and a plurality of flow channels disposed between the inlet part and the outlet part and configured to allow the refrigerant to flow, wherein the plurality of flow channels is arranged to have a spirally bent shape, and parts of the plurality of flow channels communicate with each other to allow the refrigerant to circulate between the flow channels.

Here, an overall shape of the plurality of bent flow channels may be formed in a shape of a circle, the inlet part may be disposed on one side of the circle, and the outlet part may be disposed on another side of the circle.

The plurality of flow channels may be extended from the inlet part to a central part of the circle, bent at the central part of the circle, and may be extended from the central part toward the outlet part.

The heat sink may include a first communication area where parts of a first flow channel and a second flow channel, which are bent at the central part of the circle, communicate with each other, and a refrigerant flowing through the first flow channel and a refrigerant flowing through the second flow channel are sharable with each other in the heat sink.

The heat sink may include a plurality of second communication areas which is formed between the first flow channel and the second flow channel and which is spaced apart by a predetermined distance from the inlet part to the outlet part.

A separation wall may be disposed between the first flow channel and the second flow channel, such that the first flow channel and the second flow channel may be spaced apart from each other.

A height of each flow channel may be in a range from 2.5 mm to 10.0 mm, a width of each flow channel may be in a range from 2.0 mm to 5.0 mm, and a width of the separation wall may be in a range from 2.0 mm to 5.0 mm.

Also, according to an example embodiment, the heat sink may further include a case configured to receive the inlet, the outlet part, and the plurality of flow channels. Here, the case may include an upper plate disposed on an upper side and a lower plate disposed on a lower side.

Effects

According to example embodiments, cooling performance of a heat sink may be enhanced using turbulence flow and counter flow.

According to example embodiments, a heat sink may have evenly distributed cooling performance through even temperature control in a contact surface between the heat sink and an electronic device.

BEST MODE FOR CARRYING OUT THE INVENTION

Figure 1A:
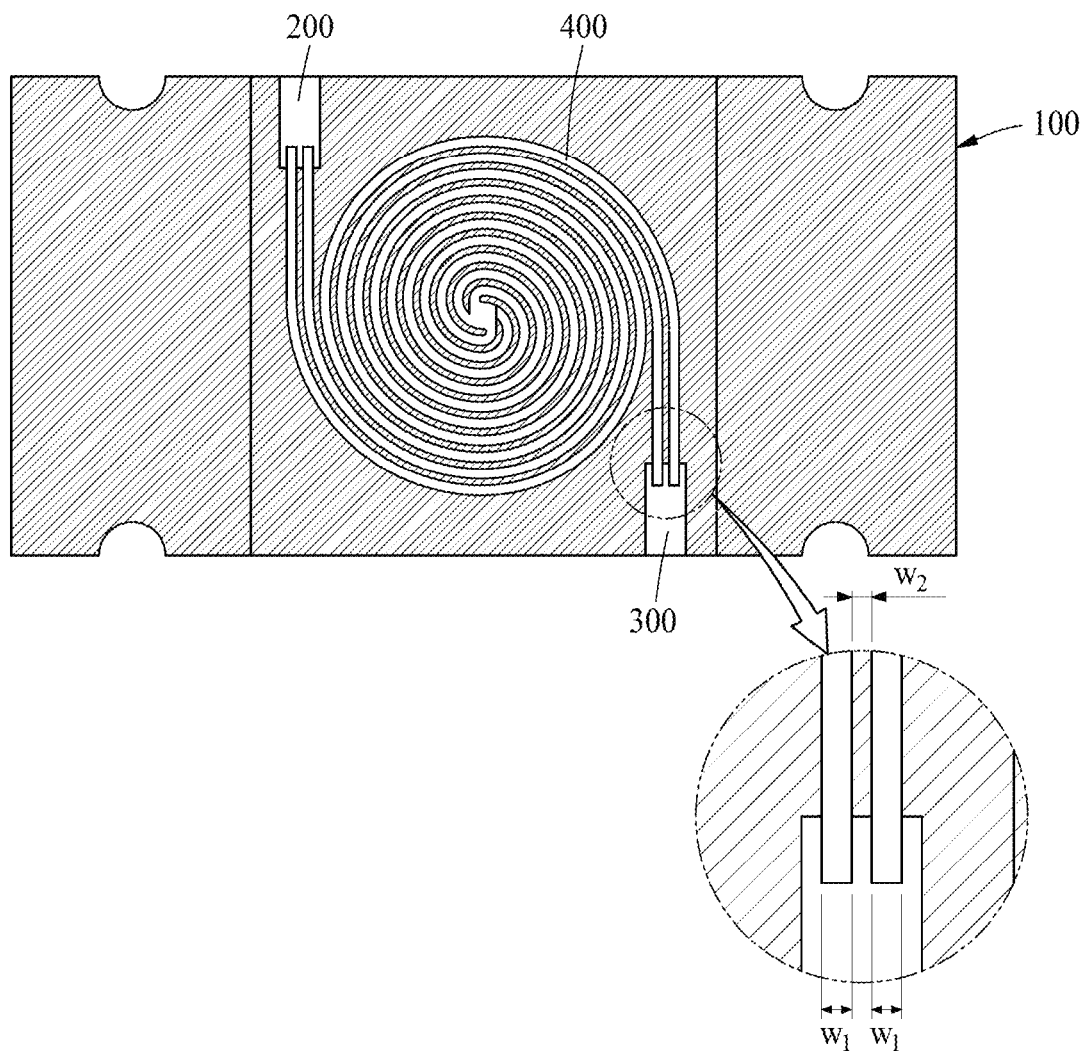
FIG. 1 illustrates a heat sink according to an example embodiment.

Hereinafter, example embodiments will be described in detail with reference to the accompanying drawings. However, various alterations and modifications may be made to the example embodiments. Here, the example embodiments are not meant to be limited by the descriptions of the present disclosure. The example embodiments should be understood to include all changes, equivalents, and replacements within the idea and the technical scope of the disclosure.

The terminology used herein is for the purpose of describing particular example embodiments only and is not to be limiting of the examples. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of the example embodiments, a detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the examples described above and an element having a common function. Unless otherwise mentioned, the descriptions of the examples may be applicable to the following examples and thus, duplicated descriptions will be omitted for conciseness.

Figure 1B:
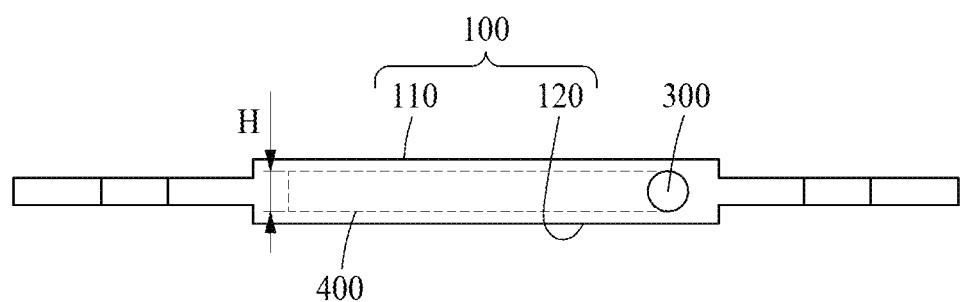
Figure 2:
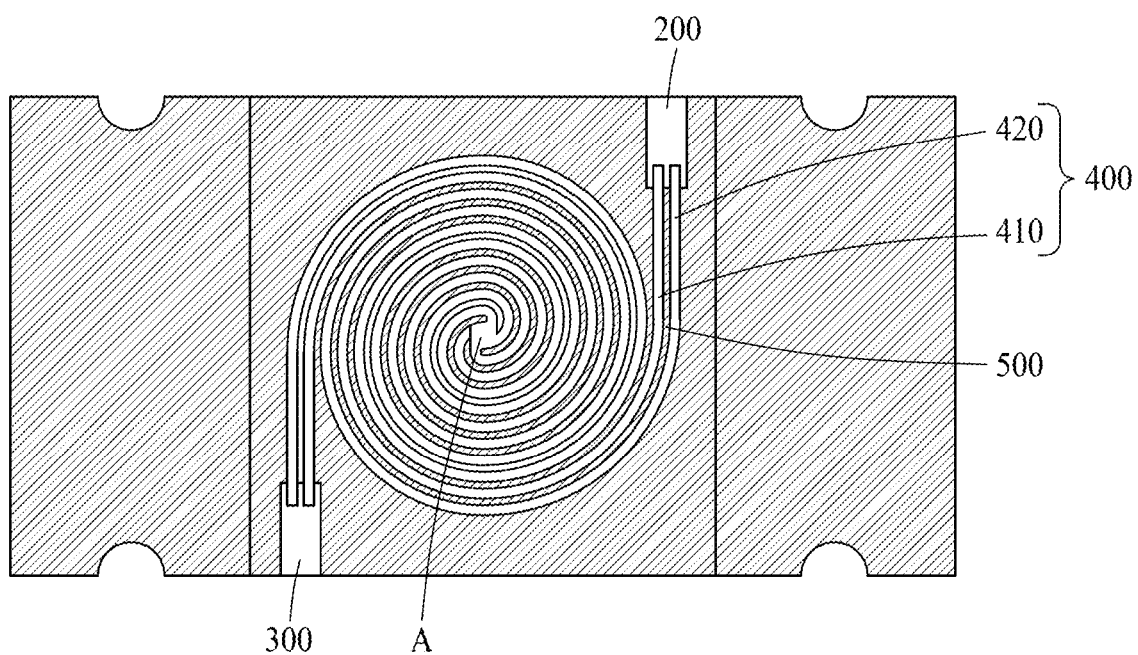
FIG. 2 illustrates a flow channel of a heat sink according to an example embodiment.
Figure 3:
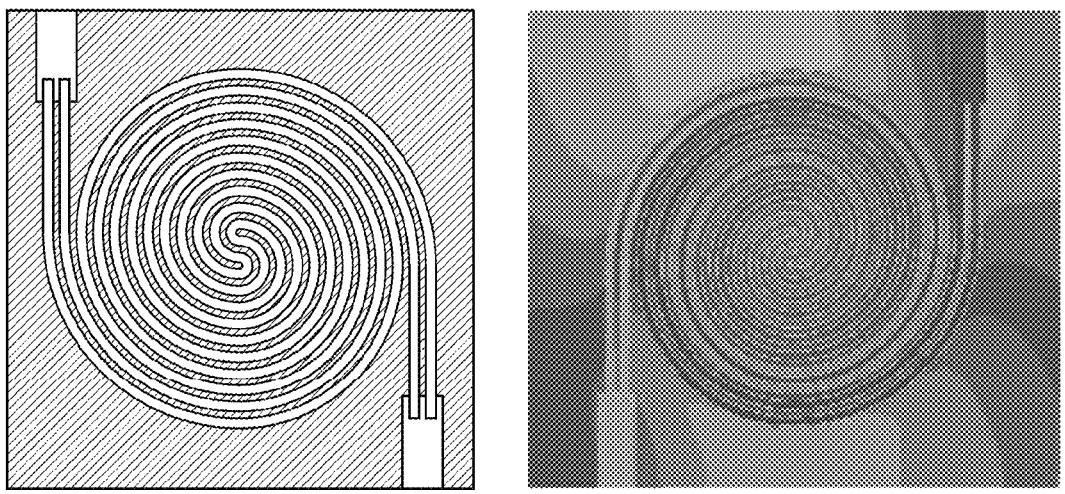
FIGS. 3 and 4 illustrate experimental data for confirming the cooling performance of a conventional heat sink and a heat sink according to an example embodiment.
Figure 4:
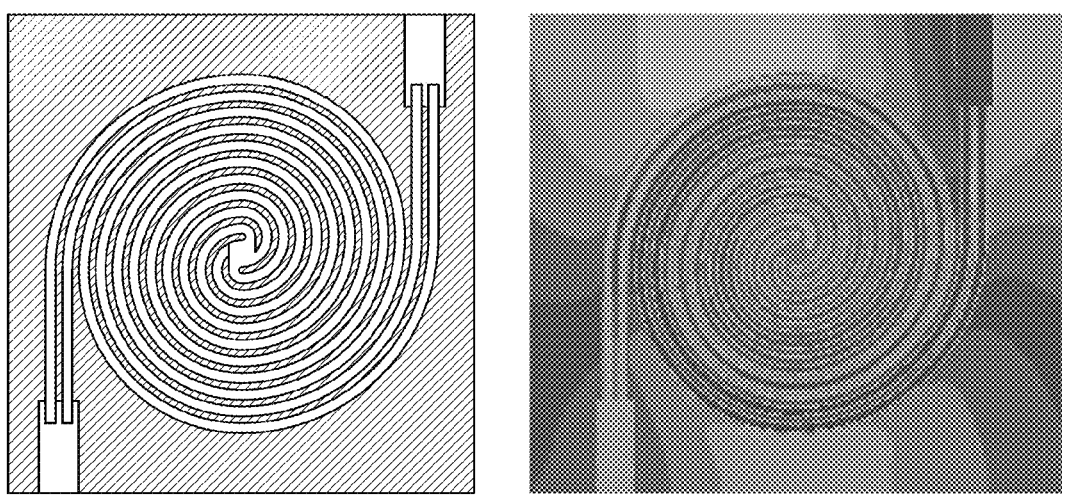
Figure 5:
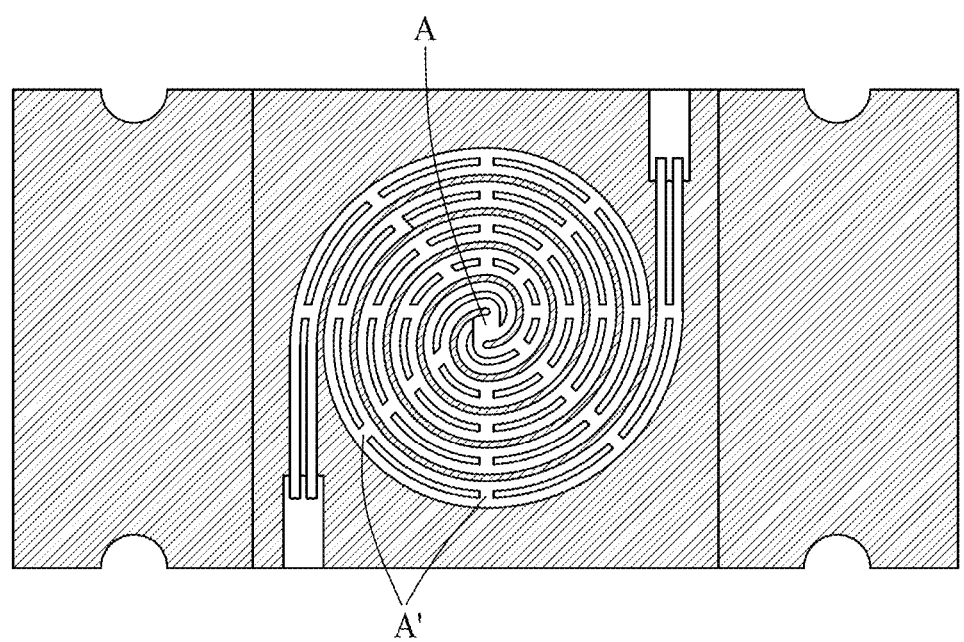
FIG. 5 illustrates a modified example of a heat sink according to an example embodiment.

FIG. 1 illustrates a heat sink according to an example embodiment, and FIG. 2 illustrates a flow channel of the heat sink according to an example embodiment in detail. FIGS. 3 and 4 illustrate experimental data for confirming the cooling performance of a conventional heat sink and a heat sink according to an example embodiment. FIG. 5 illustrates a modified example of a heat sink according to an example embodiment.

Referring to FIG. 1, a heat sink according to an example embodiment may include an inlet part 200 through which a refrigerant enters, an outlet part 300 through which the refrigerant received from the inlet part 200 is discharged, and a plurality of flow channels 400, which transfer the refrigerant, disposed between the inlet part and the outlet part.

Also, the heat sink may further include a case 100 which receives the inlet part, the outlet part, and the plurality of flow channels. Here, the case 100 may include an upper plate 110 disposed on the upper side and a lower plate 120 disposed on the lower side.

Here, the plurality of flow channels 400 may be arranged to have a spirally bent shape, and the refrigerants which flow through the plurality of flow channels may be circulated between each flow channel, since parts of the plurality of flow channels communicate with each other.

Also, a height H of each flow channel may be in the range from 6.5 mm to 11.5 mm, a width W1 of each flow channel may be in the range from 3.5 mm to 4.5 mm, and a width W2 of a separation wall may be in the range from 2.5 mm to 3.0 mm. As an example, the height H of each flow channel may be 9 mm, the width W1 of each flow channel may be 4 mm, and the width W2 of the separation wall which will be described below may be 2.75 mm.

Specifically, referring to FIG. 2, the overall shape of the plurality of bent flow channels may be formed to be circular. That is, by arranging the plurality of flow channels in a bent shape, the form of the edge of the plurality of flow channels may be an almost circular shape.

Here, a part of the edge part of the flow channel may be extended toward the inlet part 200, and the other part of the edge of the flow channel may be extended toward the outlet part 300. That is, the inlet part may be disposed on one side of the circle and the outlet part may be disposed on the other side of the circle.

Accordingly, the plurality of flow channels 400 may be extended from the inlet part 200 to the central part of the circle, and each flow channel may be bent at the central part of the circle and then be extended from the central part of the circle to the outlet part.

As an example, the plurality of flow channels may include a first flow channel 410 and a second flow channel 420. Here, a first communication area A may be formed, in which a part of the first flow channel 410 and a part of the second flow channel 420, which are bent at the central part of the circle, are communicate with each other. Through such a structure of the first communication area A, the refrigerant flowing through the first flow channel 410 and the refrigerant flowing through the second flow channel 420 may be shared.

Also, a separation wall 500 may be disposed between the first flow channel 410 and the second flow channel 420, so the first flow channel and the second flow channel may be spaced apart.

Hereinafter, it will be described that the cooling effect according to the present invention may be significantly enhanced compared to conventional technology.

Although cooling water was used as the refrigerant for heat sink-performance review, the refrigerant applied to the heat sink according to the present invention is not necessarily limited thereto.

The heat sink of a spiral structure in which the refrigerant flows in a counter-flow method has higher cooling performance than a multi-loop heat sink and may cool the heat source evenly because variation of the cooling performance of each area is low.

However, as the flow channel area decreases, flow velocity increases for the same flow rate, and there is a large pressure loss due to the long length of the flow channel. Therefore, it is necessary to analyze the variables of the design of the spiral-structure heat sink to enhance the cooling performance and find a method to reduce pressure loss.

Analysis of the design parameter of the spiral-structure heat sink may be performed by height, width, and the number of the flow channel and the width of the separation wall. The height and width of the flow channel may affect the area of the flow channel of the heat sink, and the width of the separation wall may affect the heat transfer performance which is caused by counter flow. Also, the number of flow channels is a parameter which may have an impact on a rapid decrease of the flow velocity and pressure of the refrigerant.

Specifically, the amount of cooling of the heat sink is slightly higher when the number of flow channels is two than one, and the pressure loss of the heat sink is far greater when the number of flow channels is one than two, as shown in Table 1 below.

TABLE 1

| CASE | Height (mm) of flow channel | Width (mm) of flow channel | Width (mm) of separation wall | Number of flow channels | $T_{aver.}$ (° C.) | Q (kW) | ΔP (kPa) |
|---|---|---|---|---|---|---|---|
| 1 | 6.5 | 3.5 | 2.50 | 1 | 86.75 | 8.85 | 112.2 |
| 2 | 6.5 | 4.5 | 2.50 | 2 | 97.05 | 8.67 | 7.9 |
| 3 | 11.5 | 4.5 | 2.50 | 1 | 92.85 | 8.85 | 17.1 |
| 4 | 11.5 | 3.5 | 2.50 | 2 | 93.35 | 8.85 | 6.6 |
| 5 | 6.5 | 4.5 | 3.00 | 1 | 91.15 | 8.74 | 45.2 |
| 6 | 6.5 | 3.5 | 3.00 | 2 | 97.2 | 8.56 | 12.8 |
| 7 | 11.5 | 3.5 | 3.00 | 1 | 91.2 | 8.82 | 28.2 |
| 8 | 11.5 | 4.5 | 3.00 | 2 | 97.35 | 8.78 | 3.5 |
| 9 | 9.0 | 4.0 | 2.75 | 1 | 90.8 | 8.78 | 33.5 |
| 10 | 9.0 | 4.0 | 2.75 | 2 | 97.5 | 8.67 | 5.6 |

In particular, when referring to Table 1, it can be confirmed that the most effective design includes two flow channels, a 9 mm height of each flow channel, a 4 mm width of each flow channel, and a 2.75 mm width of the separation wall as shown in Case 10, considering both the cooling amount and pressure loss.

In addition, the cooling performance increases when there are two flow channels, and the first flow channel and the second flow channel communicate with each other at the central part of the circle as shown in FIG. 4, compared to when the first flow channel and the second flow channel do not communicate at the central part of the circle as shown in FIG. 3, according to experimental data.

Specifically, Table 2 below shows that in a structure in which two flow channels are formed and the first flow channel and the second flow channel communicate with each other at the central part, cooling amount increases by 1.61% compared to a structure in which there is no communication.

|  | Structure in which first flow channel and second flow channel do not communicate at central part | Structure in which first flow channel and second flow channel communicate at central part | Notes |
|---|---|---|---|
| Cooling Amount (kW) | 18.68 | 18.98 | 1.61% ↑ |
| Pressure Loss (kPa) | 2.63 | 2.72 | 3.67% ↑ |

That is, it can be confirmed that cooling efficiency can be enhanced by maximizing the cooling amount by forming a plurality of flow channels and communicating each flow channel at a part, as in the present invention.

In addition, referring to FIG. 5, a plurality of second communication areas A' which are formed between the first flow channel and the second flow channel, spaced apart by a predetermined distance from the inlet part to the outlet part.

The heat sink which includes the structure explained above according to an example embodiment may enhance the cooling performance by evenly reaching thermal equilibrium and may distribute thermal equilibrium more evenly by reducing the stagnant time of a fluid.

While this disclosure includes specific examples, it will be apparent to one of ordinary skill in the art that various changes in form and details may be made in these examples without departing from the spirit and scope of the claims and their equivalents. The example embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:
1. A heat sink comprising:
an inlet part through which a refrigerant is introduced;
an outlet part through which the refrigerant received from the inlet part is discharged; and
a plurality of flow channels disposed between the inlet part and the outlet part, and configured to allow the refrigerant to flow,
wherein the plurality of flow channels is arranged to have a spirally bent shape, and
a plurality of parts of the plurality of flow channels communicate with each other to allow the refrigerant to circulate between the plurality of the flow channels,
wherein an overall shape of the plurality of bent flow channels is formed in a shape of a circle, the inlet part is disposed on one side of the circle, and the outlet part is disposed on another side of the circle, and
the plurality of flow channels is extended from the inlet part to a central part of the circle, bent at the central part of the circle, and extended from the central part toward the outlet part wherein the heat sink comprises a first communication area where parts of a first flow channel and a second flow channel, which are bent at the central part of the circle, communicate with each other, and a refrigerant flowing through the first flow channel and a refrigerant flowing through the second flow channel are sharable with each other in the heat sink, wherein the heat sink comprises a plurality of second communication areas which is formed between the first flow channel and the second flow channel and which is spaced apart by a predetermined distance from the inlet part to the outlet part.

2. The heat sink of claim 1, further comprising:
a case configured to receive the inlet part, the outlet part, and the plurality of flow channels,
wherein the case comprises:
an upper plate disposed on an upper side; and
a lower plate disposed on a lower side.

3. The heat sink of claim 1, wherein a separation wall is disposed between the first flow channel and the second flow channel such that the first flow channel and the second flow channel are spaced apart from each other.

4. The heat sink of claim 3, wherein a height of each flow channel is in a range from 2.5 mm to 10.0 mm.

5. The heat sink of claim 3, wherein a width of each flow channel is in a range from 2.0 mm to 5.0 mm.

6. The heat sink of claim 3, wherein a width of the separation wall is in a range from 2.0 mm to 5.0 mm.

* * * * *